(12) United States Patent
Nishimori et al.

(10) Patent No.: US 6,257,391 B1
(45) Date of Patent: *Jul. 10, 2001

(54) PART SUPPLYING DEVICE AND METHOD FOR SUPPLYING PARTS USING THE SAME DEVICE

(75) Inventors: Yuzo Nishimori; Makito Seno, both of Yamanashi; Masato Tanino, Kofu, all of (JP)

(73) Assignee: Matsushita Electric Industrial Co., Ltd., Kadoma (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/194,206
(22) PCT Filed: May 20, 1997
(86) PCT No.: PCT/JP97/01692
§ 371 Date: Nov. 20, 1998
§ 102(e) Date: Nov. 20, 1998
(87) PCT Pub. No.: WO97/44156
PCT Pub. Date: Nov. 27, 1997

(30) Foreign Application Priority Data

May 22, 1996 (JP) .................................................. 8-126666

(51) Int. Cl.⁷ .................................................. B65G 37/00
(52) U.S. Cl. ........................... 198/358; 414/416; 29/740; 29/741; 29/832
(58) Field of Search ................................ 198/339.1, 358; 414/222.02, 225.01, 226.01, 416, 811; 29/740, 741, 743, 832, 834, 836

(56) References Cited

U.S. PATENT DOCUMENTS 5,979,045 * 11/1999 Nishimori et al. ..................... 29/740

FOREIGN PATENT DOCUMENTS

| 0 391 707 | 10/1990 | (EP) . |
| 61-121397 | 6/1986 | (JP) . |
| 62-199322 | 9/1987 | (JP) . |
| 3-72698 | 3/1991 | (JP) . |
| 3-131431 | 6/1991 | (JP) . |
| 3-321326 | 9/1991 | (JP) . |

* cited by examiner

Primary Examiner—Joseph E. Valenza
(74) Attorney, Agent, or Firm—Wenderoth, Lind & Ponack, L.L.P.

(57) ABSTRACT

A component feed apparatus includes a first feed table (9, 9a) loaded with a plurality of component feed cassettes (1) thereon and moving in a manner so that the first feed table can be positioned in a right-left direction as an arrangement direction of the component feed cassettes. A second feed table (10, 10a) is located at the rear of the first feed table and is loaded and arranged with a plurality of component feed cassettes (1) in the right-left direction. Also, a component transfer unit (8) which is located at the lateral side of the first feed table and moves so that the component transfer unit can be positioned in the right-left direction, thereby receiving components from the component feed cassettes on the second feed table and sending the components forward.

15 Claims, 5 Drawing Sheets

Fig.1

PART SUPPLYING DEVICE AND METHOD FOR SUPPLYING PARTS USING THE SAME DEVICE

BACKGROUND OF THE INVENTION

1. Technical Field

The present invention relates to a component feed apparatus for feeding components to a working machine such as a component mounting apparatus which sucks electronic components thereby mounting the components to a circuit board, and a method for feeding components with the apparatus.

2. Description of Related Art

A conventional component feed apparatus of a type referred to above is generally constituted as is disclosed in Japanese Unexamined Patent Publication No. 3-221326.

FIG. 4 shows the structure of a conventional component feed apparatus. In the apparatus, a first feed table 2 and a second feed table 3, capable of holding a plurality of component feed cassettes 1 thereon, are movably arranged on a rail 4. Each table is guided and supported by a driving means provided thereat to reciprocate in a direction of an arrangement of the component feed cassettes 1. Reference numeral 5 denotes a mounting head which sucks and carries the components in the component feed cassettes 1 for mounting on a board 7 that is positioned by an XY table 6.

In the thus-constituted apparatus, when component feed cassettes which contain the same kind of electronic components are respectively set to the feed tables 2, 3, one table can be switched to the other table on the occurrence of a shortage of components at the one table. In the meantime, components are replenished to the one table at which the component shortage has occurred. For instance, when components are being fed to the mounting head 5 from the first feed table 2 as indicated in the drawing, and if the first feed table 2 happens to be short of components, the first feed table 2 and the second feed table 3 are moved leftward in FIG. 4, then components are fed from the second feed table 3 to the mounting head 5 while components are replenished to the first feed table 2.

In the case where there are a variety of types of components to be used, different types of components are stored in feed cassettes 1 set to the feed tables 2, 3, so that the components are fed to the mounting head 5 through switching of the tables 2, 3.

As enhanced productivity is currently demanded without expanding a factory scale, the electronic component mounting apparatus alike is required to be improved in productivity per area and operation rate.

According to the above prior art apparatus, however, not only a component feed space F, but standby spaces G, H at both sides of the feed space F should be secured because of the linear side-by-side arrangement of the feed tables 2, 3 in the same direction as a board transfer direction x. This is an obstacle to shortening of a production line, i.e., enhancement in productivity per area.

Additionally, in the case where one feed table becomes short of components during the component supply, both feed tables are moved to position the other feed table at a component feed position, resulting in deterioration of component feed efficiency.

The present invention has for its object to provide an apparatus and a method for feeding components in a compact arrangement with high productivity.

SUMMARY OF THE INVENTION

In order to accomplish this and other objects, the present invention is constructed as follows.

According to a first aspect of the present invention, there is provided a component feed apparatus which comprises:
 a first feed table loading a plurality of component feed cassettes thereon and for moving so that the table can be positioned in a right-left direction which is an arrangement direction of the cassettes;
 a second feed table located at a back of the first feed table and loading and arranging a plurality of component feed cassettes thereon in the right-left direction; and
 a component transfer unit set at a lateral side of the first feed table and for moving so that the unit can be positioned in the right-left direction, thereby receiving the component from the component feed cassette on the second feed table and sending the component forward,
 wherein when a leading end part of each component feed cassette on the first feed table or a leading end part of the component transfer unit is positioned at a component feed point, the component at the position is supplied to a working machine located forward of the apparatus.

According to a second aspect of the present invention, there is provided the component feed apparatus of the first aspect wherein the first feed table and the component transfer unit are guided and supported by a common rail in a manner to move independently of each other in the right-left direction.

According to a third aspect of the present invention, there is provided the component feed apparatus of the first or second aspect wherein the second feed table is adapted to move so that the second feed table can be positioned in the right-left direction in.

According to a fourth aspect of the present invention, there is provided the component feed apparatus of the first or second aspect, is constructed so that the second feed table is fixed.

According to a fifth aspect of the present invention, there is provided the component feed apparatus of the first, third, or fourth aspect, wherein the first feed table and the component transfer unit are coupled integrally in one body.

According to a sixth aspect of the present invention, there is provided the component feed apparatus of the first, second, third, fourth, or fifth aspect, wherein the transfer unit is adapted to receive a plurality of components from the component feed cassettes on the second feed table and keep the components before supplying to the working machine.

According to a seventh aspect of the present invention, in the component feed apparatus according to any one of the first through sixth aspects, wherein component feed cassettes storing components of the same kind as those of the component feed cassettes on the first feed table are loaded on the second feed table in order to cope with component shortage consequent to component consumption, and the apparatus further comprises a control part for controlling so that in case of component shortage at the component feed cassette on the first feed table, the component from the corresponding component feed cassette on the second feed table is supplied to the working machine via the component transfer unit.

According to an eighth aspect of the present invention, there is provided the component feed apparatus of the seventh aspect wherein the control part controls the component transfer unit and the second feed table to move relative to each other when the component feed cassette on the first feed table is present at the component feed point, so that the component transfer unit is always at a position where the component transfer unit can receive the component from the component feed cassette on the second feed table storing components of the same kind as the component feed cassette on the first feed table.

According to a ninth aspect of the present invention, there is provided the component feed apparatus according to the fourth aspect, wherein component feed cassettes storing components of the same kind as those of the component feed cassettes on the first feed table are loaded on the second feed table symmetrically in the right-left direction to the component feed cassettes on the first feed table in order to cope with component shortage consequent to component consumption. The apparatus further comprises a control part which positions the component transfer unit always at a position where the component transfer unit can receive the component from the component feed cassette on the second feed table corresponding to the component feed cassette on the first feed table when the component feed cassette on the first feed table is located at the component feed point, and controls so that in case of the component shortage at the component feed cassette on the first feed table, the component from the corresponding component feed cassette on the second feed table is supplied to the working machine via the component transfer unit.

According to a 10th aspect of the present invention, there is provided the component feed apparatus of the sixth aspect, wherein component feed cassettes storing components of the same kind as those of the component feed cassettes on the first feed table are loaded on the second feed table in order to cope with component shortage consequent to the component consumption. The apparatus further comprises a control part which controls so that in case of the component shortage at the component feed cassette on the first feed table, the component from the corresponding component feed cassette on the second feed table is delivered to the component transfer unit and kept at the component transfer unit, and then, a component of another component feed cassette of the component feed cassettes on the first feed table is fed to the working machine while preceding to the run-out component feeding until the components present in the component feed cassettes on the first feed table are completely supplied to the working machine, and thereafter, the component kept at the component transfer unit is supplied to the working machine.

According to an 11th aspect of the present invention, there is provided a method for feeding the components to the working machine with the use of the component feed apparatus according to the first or second aspect, wherein component feed cassettes storing components of the same kind as those of the component feed cassettes on the first table are loaded on the second feed table in order to cope with component shortage consequent to the component consumption, so that in case of the component shortage at the component feed cassette on the first feed table, the component from the corresponding component feed cassette on the second feed table is supplied to the working machine via the component transfer unit.

According to a 12th aspect of the present invention, there is provided the component feed method according to the 11th aspect, wherein the component transfer unit and the second feed table are positionally controlled to move relatively to each other when the component feed cassette on the first feed table is located at the component feed point so that the component transfer unit is always at a position where the component transfer unit can receive the component from the component feed cassette on the second feed table storing components of the same kind as those of the component feed cassette on the first feed table.

According to a 13th aspect of the present invention, there is provided a method for feeding the components to the working machine with the use of the component feed apparatus in the fourth aspect in which the first feed table and the component transfer unit are coupled integrally in one body, wherein component feed cassettes storing components of the same kind as those of the component feed cassettes on the first feed table are loaded on the second feed table symmetrically in the right-left direction to the component feed cassettes on the first feed table in order to cope with component shortage consequent to the component consumption. Also, the component transfer unit is positioned so as to be always at a position where the component transfer unit can receive the component from the component feed cassette on the second feed table corresponding to the component feed cassette on the first feed table when the component feed cassette on the first feed table is located at the component feed point, so that in case of the component shortage at the component feed cassette on the first feed table, the component from the corresponding component feed cassette on the second feed table is supplied to the working machine via the component transfer unit.

According to a 14th aspect of the present invention, there is provided a method for feeding the components to the working machine with the use of the component feed apparatus of the sixth aspect, wherein component feed cassettes storing components of the same kind as those of the component feed cassettes on the first feed table are loaded on the second feed table in order to cope with component shortage consequent to the component consumption, whereby in case of the component shortage at the component feed cassette on the first feed table, the component from the corresponding component feed cassette on the second feed table is delivered to the component transfer unit and kept at the component transfer unit, and then, a component of another component feed cassette of the component feed cassettes on the first feed table is fed to the working machine while preceding to the run-out component feeding until the components present in the component feed cassettes on the first feed table are completely supplied to the working machine, and thereafter, the component kept at the component transfer unit is supplied to the working machine.

According to the component feed apparatus and component feed method in the above arrangement, the first and second feed tables can be aligned in two rows at the rear of the working machine, thereby reducing a breadth of the component feed apparatus in the right-left direction, thus improving productivity per area, while at the same time enabling smooth supply of components to the working machine from the second feed table via the component transfer unit. If the second feed table is employed to hold replenishment components for the component shortage, move amounts of the first feed table, component transfer unit, etc. in this case can be reduced as compared with the move amounts of the component feed tables at in the prior art, so that feed efficiency in case of the component shortage can be improved.

In the component feed apparatus and method in the above aspects of the present invention, the component transfer unit is controlled in position to be always at a position where the component transfer unit can receive the component from the component feed cassette on the second feed table corresponding to the component feed cassette on the first feed table when the component feed cassette on the first feed table is located at the feed point, whereby the component can be quickly supplied from the component feed cassette on the second feed table in case of the component shortage.

Further, in the component feed apparatus and method in the above aspects of the present invention, the components are supplied to the working machine with the use of the component feed apparatus having the second feed table fixed and moreover the first feed table and component transfer unit coupled in one body. It is preferably to be so constructed that in order to cope with component shortage consequent to the component consumption, the component feed cassettes storing the components of the same kind as those of the component feed cassettes on the first feed table are loaded on the second feed table to be symmetric in the right-left direction to the corresponding component feed cassettes on the first feed table, and the component transfer unit is positioned to be always at a position where the component transfer unit can receive the component from the component feed cassette on the second feed table corresponding to the component feed cassette on the first feed table when the component feed cassette on the first feed table is located at the feed point, so that in case of the component shortage at the component feed cassette on the first feed table, the component is supplied from the corresponding component feed cassette on the second feed table to the working machine via the component transfer unit.

In the above construction, since the second feed table can be fixed and the component transfer unit can be attached to the first feed table, not only can the structure be simplified, but the component supply from the component feed cassette on the second feed table can be performed quickly in case of the component shortage by simply controlling the movement of the first feed table in the right-left direction.

Further, according to the component feed apparatus and method of the aspects of the present invention, the components are supplied to the working machine with the use of the component feed apparatus wherein the component transfer unit is constructed so as to receive and hold a plurality of components from the component feed cassettes on the second feed table before supplying to the working machine. In order to cope with the component shortage resulting from the component consumption, preferably, the component feed cassettes storing the components of the same kind as those of the component feed cassettes on the first feed table are loaded on the second feed table, so that when the component feed cassette on the first feed table runs out of components, the component from the corresponding component feed cassette on the second feed table is delivered to the component transfer unit and kept at the component transfer unit. And then, a component of another component feed cassette of the component feed cassettes on the first feed table is fed to the working machine while preceding to the run-out component feeding until the components present in the component feed cassettes on the first feed table are completely supplied to the working machine, and thereafter, the component kept at the component transfer unit is supplied to the working machine.

According to the above arrangement, after the components from the component feed cassettes on the first feed table except for the components subject to the component shortage are smoothly supplied with priority, components are successively smoothly supplied from the component transfer unit in which replenishment components to cope with the component shortage is previously kept, thereby improving component feed efficiency.

BRIEF DESCRIPTION OF DRAWINGS

These and other objects and features of the present invention will become clear from the following description taken in conjunction with reference to the accompanying drawings, in which:

FIG. 1 is a schematic plan view showing a component feed apparatus according to a first embodiment of the present invention;

DETAILED DESCRIPTION OF THE INVENTION

Figure 2:
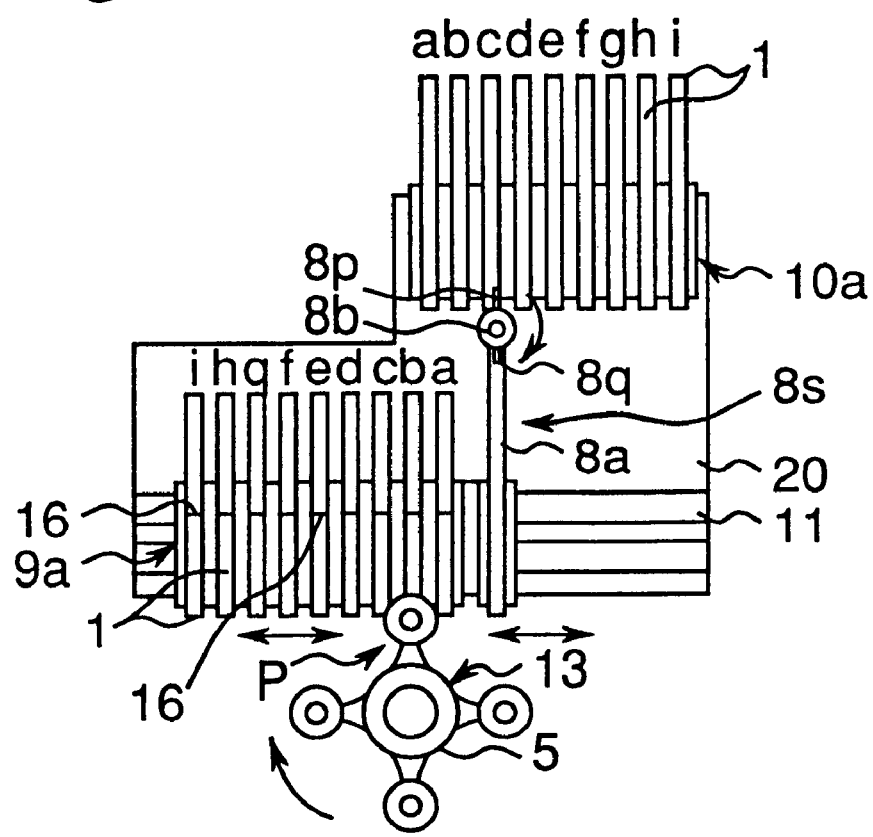
FIG. 2 is a schematic plan view showing a component feed apparatus according to a second embodiment of the present invention.

Before the description of the present invention proceeds, it is to be noted that like parts are designated by like reference numerals throughout the accompanying drawings.

Embodiments of the present invention will be described hereinbelow with reference to the drawings.

Figure 1:
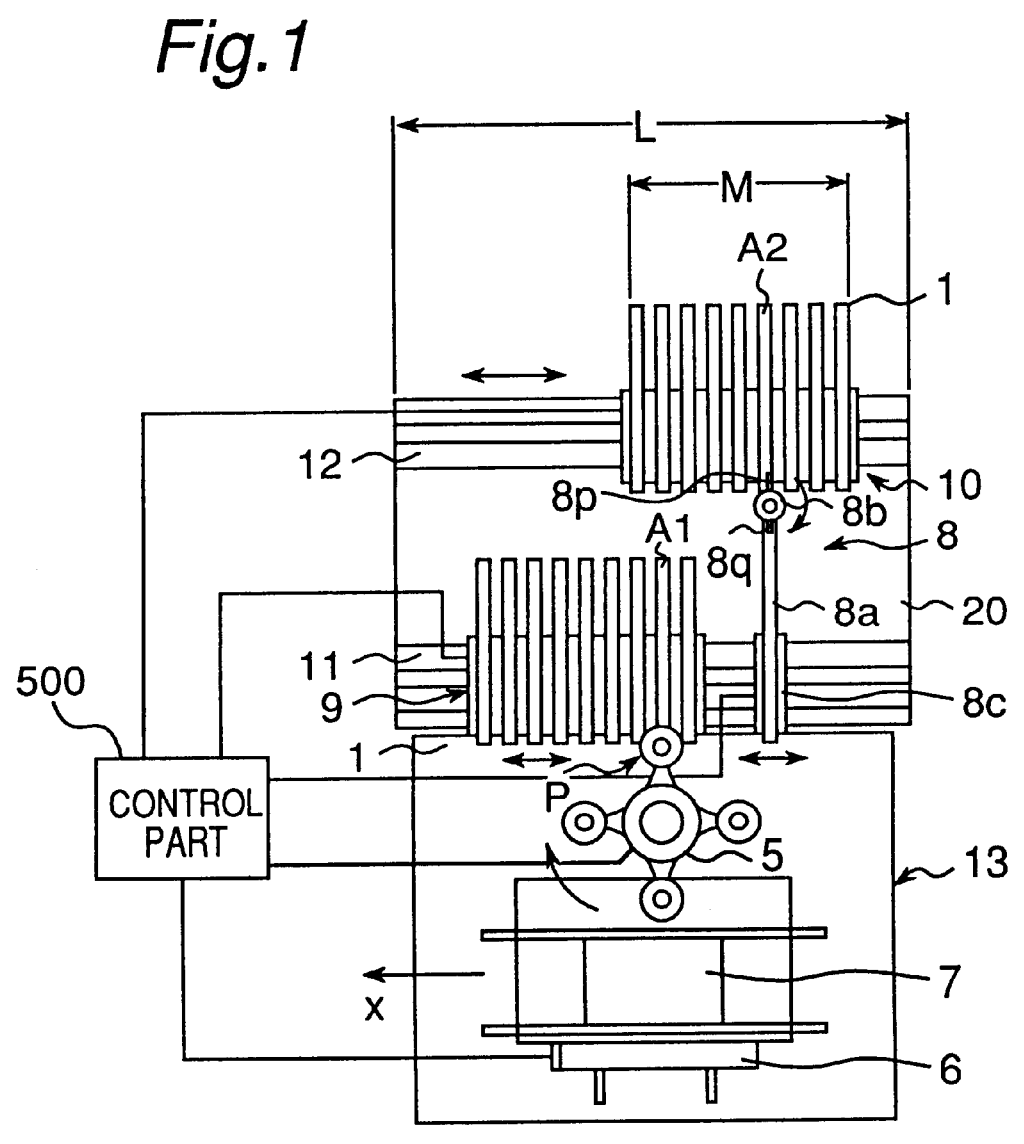

FIG. 1 is a schematic plan view showing a component feed apparatus according to a first embodiment of the present invention. In FIG. 1, reference numerals 9 and 10 denote first and second component feed tables at which many component feed cassettes 1 are arranged in parallel, and where a plurality of kinds of cassettes storing the same kind of electronic components are set at each of the feed tables.

The first, second feed tables 9, 10 are guided and supported respectively by first and second rails 11, 12 disposed in parallel to each other on a base 20. Each table can be reciprocated by a driving device provided thereat on the rail 11 or the rail 12 in a direction of a parallel arrangement of the component feed cassettes 1, namely, in a right-left direction in FIG. 1. The second feed table 10 is located at the back of the first feed table 9 and so close to each other that both tables 9, 10 are spaced so as to be freely movable without contacting with each other.

A reference numeral 8 denotes a component transfer unit that is guided and supported in a manner to be movable back and forth on the first rail 11 which is present forward of the second rail. The component transfer unit 8 sucks a required optional component from the component feed cassette 1 on the second feed table 10 and feeds to a working machine (e.g., component mounting apparatus) 13 located in front of the first rail 11. The component transfer unit 8 is constituted of, for instance, a conveyor 8a, a rotary suction head 8b equipped with a pair of suction nozzles 8p, 8q, and a guide block 8c which supports the conveyor 8a and the rotary suction head 8b and can reciprocate on the first rail 11.

Components can be sucked and supplied one by one by the component transfer unit 8 from the second feed table 10 to the working machine 13 every time the first feed table 9 runs out of components. However, the component transfer unit 8 is adaptable, as will be described later, to suck and feed the run-out components altogether to the component mounting apparatus 13 after the components except for the run-out components at the first feed table 9 are completely supplied.

Figure 5:
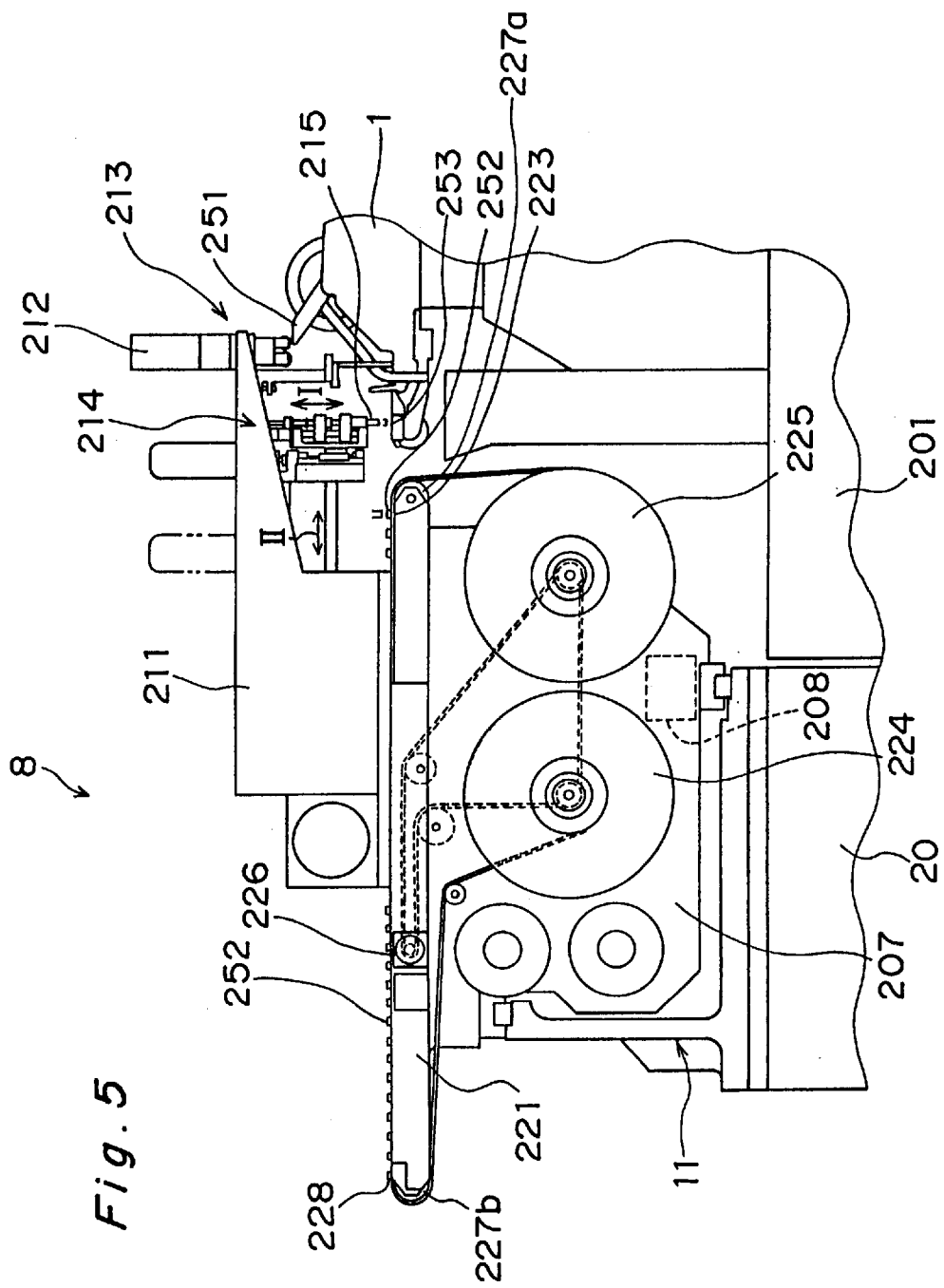
FIG. 5 is a side view illustrating an example of a component transfer unit in the embodiments of the present invention.

FIG. 5 shows an example of the component transfer unit 8. A component transfer unit 8s to be described later has the same mechanism. A difference of the transfer unit 8 of FIG. 5 from FIG. 1 is that one suction nozzle 215 is provided in place of the suction head 8b having the pair of suction nozzles 8p, 8q and the suction nozzle 215 reciprocates in a y-direction orthogonal to an x-direction. Both component transfer units operate almost in the same manner except that the pair of suction nozzles rotate, whereas the suction nozzle 215 reciprocates. The operation of the component transfer unit 8 will be described in detail with reference to FIG. 5.

The component transfer unit 8 is set on a table 207 engaged with the first rail 11 extended in the x-direction which is the arrangement direction of the component feed cassettes 1 on the base 20. The table 207 is driven by a moving device 208 of the component transfer unit 8, thereby letting the transfer unit 8 slide on the first rail 11.

The above component transfer unit 8 includes a transfer device 211 and a component carry device 221.

The transfer device 211 has a feed lever drive device 213 and a nozzle unit 214. The feed lever drive device 213 presses down a feed lever 251 set at a component feed part of the component feed cassette 1. An air cylinder 212 is used as a driving source for the feed lever drive device 213 in the embodiment. The feed lever 251 has a ratchet mechanism. When the feed lever 251 is pressed down by the feed lever drive device 213, because of a ratchet mechanism of the feed lever 251, the component feed cassette 1 sends out a temporary fixing tape wound therearound and feeds components 252 adhering to the tape one by one to a component selection position 253. The nozzle unit 214 has a mechanism enabling the suction nozzle 215 to be moved by a cam in a I direction in the drawing which corresponds to a vertical z-direction, and a II direction which corresponds to the y-direction orthogonal to the x-direction, that is, the I direction and the arrangement direction of the component feed cassettes 1. The nozzle unit 214 also has a mechanism capable of automatically selecting the suction nozzle 215 to fit the component 252 to be held. The suction nozzle 215 moves downward in the I direction at the component selection position 253, sucks the component 252, moves up, thereby holding the sucked component. The nozzle unit 214 moves in the II direction to place the held component 252 to a transfer start position 223 on the conveyor 8a of the component transfer unit 8.

The component carry device 221 has the conveyor 8a, a feed reel 225 with the conveyor 8a wound thereto, a wind reel 224 taking up the conveyor 8a, and a motor 226 as a driving source for moving the conveyor 8a.

The conveyor 8a in the embodiment is an adhesive tape. A face of the conveyor 8a where the component 252 is loaded is adhesive. The conveyor 8a is stretched in the II direction between two pulleys 227a and 227b arranged in the II direction. Feed holes (not shown) are opened via a constant distance in an extension direction of the conveyor 8a at a side edge part in a breadthwise direction orthogonal to the extension direction. When the feed holes are engaged with projections formed at the pulleys 227a, 227b, the pulley 227b is driven by the motor 226 via a timing belt, and consequently the conveyor 8a is moved in the II direction.

The component carry device 221 constituted as above operates in a manner described hereinbelow. The conveyor 8a sent out from the feed reel 225 moves to the transfer start position 223 after being engaged with the pulley 227a. The component 252 is placed on the conveyor 8a by the suction nozzle 215 at the transfer start position 223. The conveyor 8a is sent by a predetermined distance in the II direction by the motor 226 every time one component 252 is loaded, so that a next component 252 can be loaded thereon. At least one component 252 is thus loaded on the conveyor 8a. The placed component 252 is carried to a transfer end position 228 through the movement of the conveyor 8a by the motor 226. In order to make the transfer end position 228 at the component carry device 221 agree with a component feed point P, the entire component transfer unit 8 is guided along the first rail 11 and moved in the x-direction by a moving device 208 of the table 207 while or after the component 252 is sent to the transfer end position 228. A nozzle (not shown) of a mounting head 5 holds the component 252 transferred by the component carry device 221 to the transfer end position 228 in a state with the transfer end position 228 coinciding with the component feed point P through the movement of the component transfer unit.

In the case where a plurality of components 252 are loaded on the conveyor 8a, the conveyor 8a is moved while being taken up by the wind reel 224, so that the plurality of components 252 placed on the conveyor 8a are sequentially transferred to the transfer end position 228 at the component carry device 221. The components 252 are hence sucked and held sequentially by the mounting head 5.

The conveyor 8a may be formed endless to be used repeatedly without the feed reel 225 and the wind reel 224 provided.

Alternatively, before the component 252 is first loaded on the conveyor 8a at the transfer start position 223, the conveyor 8a may be sequentially returned by a predetermined length to the feed reel 225 to avoid an inutile use of the conveyor 8a stretched between the transfer start position 223 and the transfer end position 228 so as to use the conveyor 8a while eliminating waste.

Referring back to FIG. 1, a reference numeral 500 denotes a control part which controls the reciprocating operation of the first feed table 9, component feed operation at a leading end part of each component feed cassette 1, reciprocating operation of the second feed table 10, component feed operation at the leading end part of each component feed cassette 1, reciprocating operation of the component transfer unit 8, rotary operation of the rotary suction head 8b, suction operation of each suction nozzle 8p, 8q, component transfer operation of the conveyor 8a, rotary operation of the mounting head 5, component suction operation and component mounting operation of the suction nozzle (not shown) of the mounting head 5, movement operation of the board by the XY table 6, and transfer operation for the board.

Figure 4:
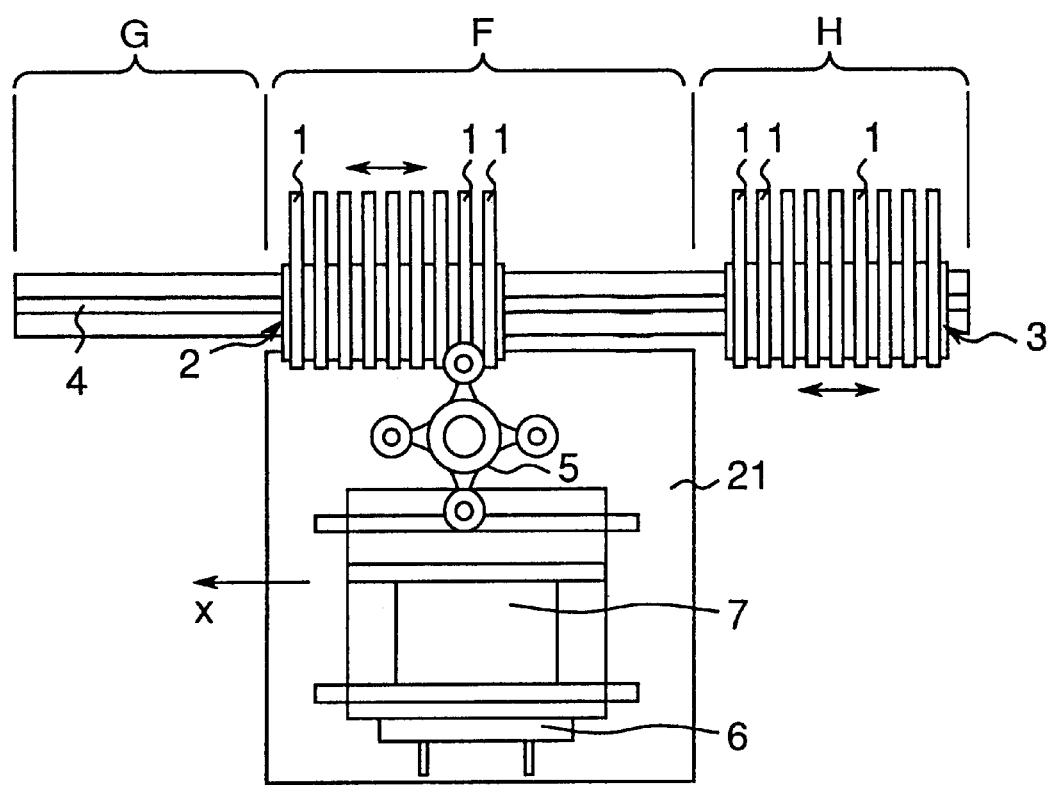
FIG. 4 is a plan view showing a conventional component feed apparatus.

A right-left length L of each of the base 20, the first rail 11, and the second rail 12 can be approximately twice a length M of each of the first feed table 9, the second feed table 10 (corresponding to a length F in FIG. 4). Therefore, the standby spaces G, H, which are necessary in the prior art device of FIG. 4, at both sides of the component feed space F are eliminated.

In the component mounting machine 13, the XY table 6 is installed in front of the first feed table 9, having the board 7 placed thereon. After the board 7 is positioned at a predetermined component mount position by the XY table 6, a required component is mounted on the board 7 by the mounting head 5. The board 7 is transferred leftward as indicated by an arrow x in FIG. 1.

In order to cope with a component shortage resulting from the component consumption in any one of the component feed cassettes 1 on the first feed table 9, component feed cassettes 1 storing components of the same kind as those of the component feed cassettes 1 on the first feed table 9 are set on the second feed table 10 of the component feed apparatus of FIG. 1, so that in the case of the component shortage, the component can be promptly supplied to the component mounting apparatus 13 from the corresponding component feed cassette of the second feed table 10 via the component transfer unit 8. The component shortage can be detected, e.g., from a suction pressure of the suction nozzle of the mounting head 5. More specifically, if the suction pressure does not reach a predetermined pressure when the suction nozzle sucks the component located at the component feed point P, the control part 500 detects that the component is not sucked by the suction nozzle and judges the component shortage. Or, in an arrangement whereby a position of the component after sucked by the suction nozzle is recognized, it is detected at the recognition time that the component is not sucked, thereby judging the component shortage.

Normally, when the first feed table 9 moves right or left and is positioned so as to bring the leading end part of a predetermined component feed cassette 1 designated by A1 in FIG. 1 to agree with the component feed point P, a predetermined component present at the leading end part of the component feed cassette 1 is sucked by the mounting head 5 and then mounted at a predetermined position of the board 7 indicated by orthogonal x, y directions of the board 7. At this time, the second feed table 10 and the component transfer unit 8 are controlled by the control part 500 to move right or left while being kept at a position not to obstruct the feed of the component from the first feed table 9, so that the control part 500 performs positional control so as to maintain a positional relation wherein the component transfer unit 8 is positioned at a position where the component transfer unit 8 can immediately receive the component from the component feed cassette 1 on the second feed table 10 denoted by A2 in FIG. 1 which corresponds to the above component feed cassette 1 of the first feed table 9.

Even if the predetermined component feed cassette 1 on the first feed table 9 becomes short of a component, under the control by the control part 500, the component transfer unit 8 can receive the component from the component feed cassette 1 on the second feed table 10 storing the same kind of the component. In this case, each part operates as follows because of the control by the control part 500. The component sucked by the suction nozzle 8p or 8q of the rotary suction head 8b is carried onto the conveyor 8a and sent forward on the conveyor 8a. While the component is sent forward, the first feed table 9 retreats leftward of FIG. 1 to the component feed point P, and the component transfer unit 8 moves towards the component feed point P and stops there. The component reaching a leading end part of the conveyor 8a at the component feed point P is sucked by the suction nozzle (not shown) of the mounting head 5 from the component feed point P and mounted to the board 7. As above, component mounting processing can be speedily performed by the replenished components even upon the occurrence of the component shortage.

An apparatus and a method for feeding components according to a second embodiment of the present invention will be discussed with reference to FIGS. 2 and 3.

Figure 3:
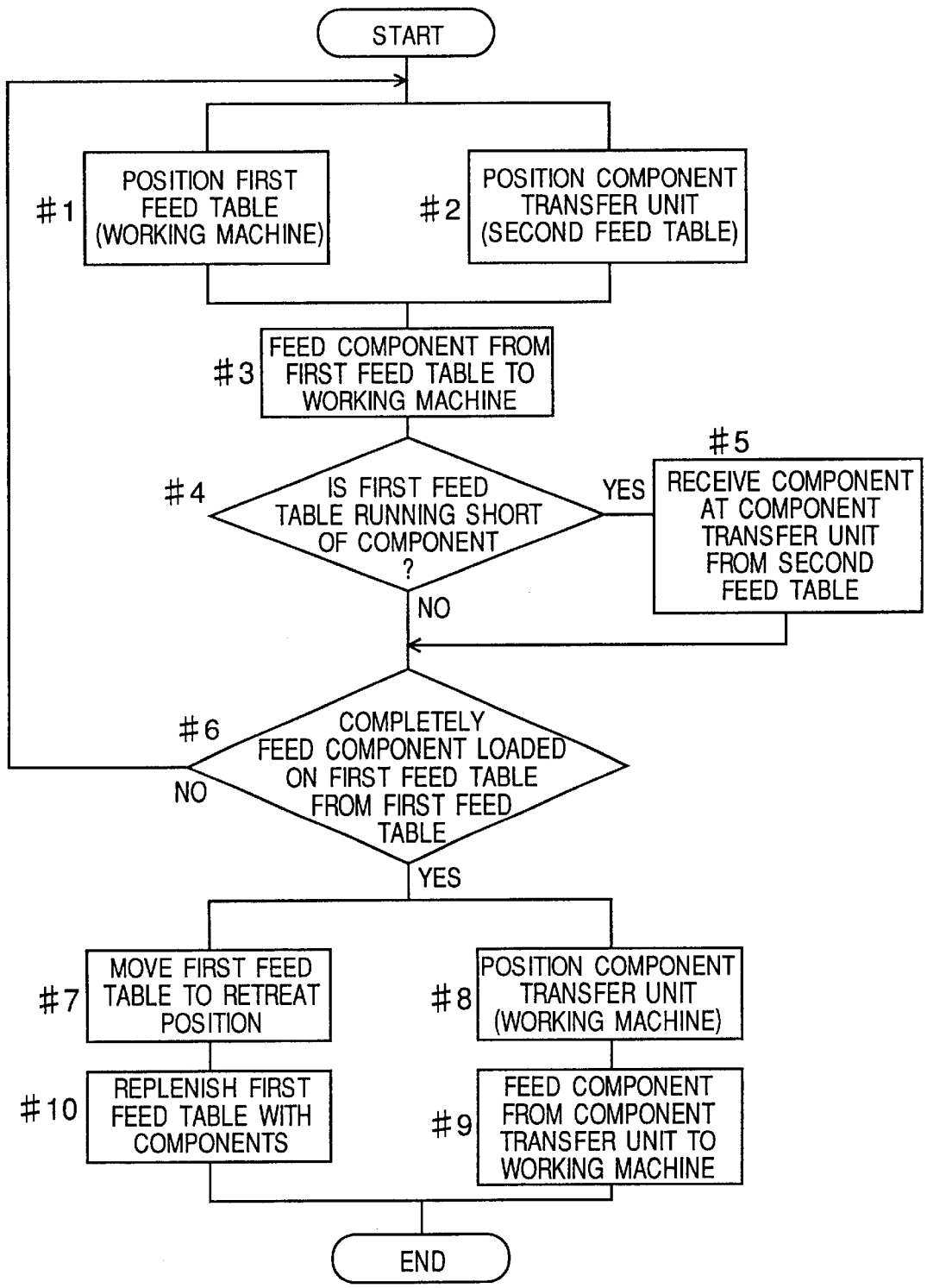
FIG. 3 is a flow chart showing an embodiment of a component feed method according to the present invention.

According to a component feed apparatus shown in FIG. 2, a second feed table 10a is different from the second feed table of the first embodiment in that it is fixed to the base 20. Moreover, a component transfer unit 8s is loaded on a first feed table 9a and integrally coupled with the first feed table 9a. Except for these points, the second embodiment is fundamentally equal to the first embodiment. As identified comparatively by a–i in FIG. 2, component feed cassettes 1, storing components of the same kind as component feed cassettes 1 on the first feed table 9a, are loaded on the second feed table 10a in a symmetrical relationship to the corresponding component feed cassettes on the first feed table 9a in the right-left direction. When the component transfer unit 8s is positioned at the right end of the first feed table 9a of FIG. 2 and, for example, the component feed cassettes 1 on the first feed table 9a denoted by b is positioned at the feed point P, the transfer unit 8s is positioned so that the component transfer unit 8s can receive the component from the corresponding component feed cassette 1 on the second feed table 10a designated by b. The remaining component feed cassettes 1, 1 denoted by a and c–i on the feed tables 9a, 10a hold the same positional relationship to the component transfer unit 8s as above.

A component remainder sensor 16 is set at each component feed cassette 1 on the first feed table 9a, and generates a component shortage signal or shortage estimation signal when the amount of components remaining in each cassette is not larger than a predetermined value. If the components are used approximately with the same frequency, the predetermined value for each cassette may be the same value. However, if the use frequency is greatly different among the components, a different value is preferably set for each cassette. Similar to the first embodiment, in the second embodiment, the component shortage can be detected through a change of the suction pressure of the suction nozzle of the apparatus head 5, instead of the component remainder sensor 16.

While the component transfer unit 8s is to receive components from the component feed cassette 1 on the second feed table 10a in the event of a component shortage, the unit 8s is capable of receiving a plurality of components, aligning them in order, retaining them on the conveyor 8a, and then feeding the plural held components to the component mounting machine 13 altogether orderly.

The component feed apparatus in the above arrangement operates under the control by the control part 500, which will be described with reference to the flow chart of FIG. 3.

The first feed table 9a is moved and positioned so that the predetermined feed cassette 1 agrees with the feed point P (step #1). The component transfer unit 8s is consequently automatically positioned at the same time (step #2). In this state, a required component is supplied from the first feed table 9a to the component mounting machine (an example of the working machine) 13 (step #3). During the feed operation of the component, the component remainder sensor 16 always monitors the presence/absence of the component shortage for each cassette in the first feed table 9a (step #4). In the case where the component shortage is detected in any of the cassettes, the component transfer unit 8s receives the component of the same kind as the component on which the occurrence of the component shortage is detected, while sucking it from the corresponding cassette on the second feed table 10a, and retains the received component (step #5).

In the same manner as above, repeatedly, components are fed to the component mounting apparatus 13 from the first feed table 9a, and components of the same kind as the depleted components are received and retained from the second feed table 10a by the transfer unit 8s. When the components-to-be-mounted on the first feed table 9a except for the depleted components are completely supplied to the mounting apparatus 13 and the transfer unit 8s completely receives from the second feed table 10a the components of the same kind as the depleted components in the first feed table (step #6), the first feed table 9a is moved to a standby position (step #7) and at the same time the transfer unit 8s is moved and positioned at the feed point P (step #8).

Next, the transfer unit 8s sequentially supplies the retained components to the component mounting apparatus 13 altogether (step #9). In the meantime, components corresponding to component shortage are replenished in the first feed table 9a (step #10), and the program is completed.

Although the components are supplied altogether at a final stage to the working machine in the method described hereinabove, the component corresponding to the shortage may be supplied from the transfer unit 8s to the mounting machine 13 each time the component feed cassette becomes short of components as in the first embodiment.

According to the present invention, components can be efficiently supplied to the working machine, and moreover the length in the transfer direction of the board can be shortened, thereby realizing the component feed apparatus and method in a compact structure.

The entire disclosure of Japanese Patent Application No. 8-126666 filed on May 22, 1996, including specification, claims, drawings, and abstract is incorporated herein by reference in its entirety.

Although the present invention has been fully described in connection with the preferred embodiments thereof with reference to the accompanying drawings, it is to be noted that various changes and modifications are apparent to those skilled in the art. Such changes and modifications are to be understood as being included within the scope of the present invention as defined by the appended claims unless they depart therefrom.

What is claimed is:

1. A component feed apparatus comprising:
    a first feed table loaded with a plurality of component feed cassettes arranged along a right-left direction, said first feed table being movable so that it can be positioned along a right-left direction;
    a second feed table located at a back side of said first feed table, said second feed table being loaded with a plurality of component feed cassettes arranged thereon along the right-left direction; and
    a component transfer unit located at a lateral side of said first feed table, said component transfer unit being movable such that said component transfer unit can be positioned along the right-left direction in order to receive a component from one of the component feed cassettes on said second feed table and transfer the received component in a forward direction,
    wherein, when a leading end part of one of the component feed cassettes on said first feed table or a leading end part of said component transfer unit is positioned at a component feed point, the component at the component feed point can be supplied to a working machine located forward of the component feed apparatus.

2. A component feed apparatus as claimed in claim 1, wherein said first feed table and said component transfer unit are guided and supported by a common rail in such a manner that said first feed table and said component transfer unit can move independently of each other in the right-left direction.

3. A component feed apparatus as claimed in claim 1, wherein said second feed table is movable so that it can be selectively positioned along the right-left direction.

4. A component feed apparatus as claimed in claim 1, wherein said second feed table is fixed in position.

5. A component feed apparatus as claimed in claim 2, wherein the second feed table is fixed in position.

6. A component feed apparatus as claimed in claim 1, wherein said first feed table is coupled to said component transfer unit.

7. A component feed apparatus as claimed in claim 1, wherein said component transfer unit is operable to receive a plurality of components from the component feed cassettes on said second feed table, retain the received components, and then supply the retained components to the working machine.

8. A component feed apparatus as claimed in claim 1, wherein at least one of said component feed cassettes on said second feed table stores components that are of the same kind as components stored in a corresponding one of said component feed cassettes on said first feed table for the purpose of coping with a component shortage due to consumption of the components stored in said one component feed cassette on said first feed table,
    said component feed apparatus further comprising a control part for controlling said component transfer unit and said second feed table such that, in a case of a component shortage at one of the component feed cassettes on said first feed table, said control part is operable to control said second feed table and said component transfer unit so that a component is delivered from the component feed cassette that corresponds to the depleted component feed cassette on said first feed table, wherein the delivered component is then supplied to the working machine via said component transfer unit.

9. A component feed apparatus as claimed in claim 8, wherein said control part controls said component transfer unit and said second feed table such that, when one of the component feed cassettes on said first feed table is located at the component feed point, said component transfer unit and said second feed table move relative to each other so that said component transfer unit is always at a position where it can receive a component from the component feed cassette on said second feed table storing components of the same kind as those of the component feed cassette located at the feed position.

10. A component feed apparatus as claimed in claim 4, wherein the component feed cassette, storing components of the same kind as those stored in the component feed cassette on said first feed table, is loaded on said second feed table symmetrically in the right-left direction with respect to the component feed cassette on the first feed table in order to cope with component shortages due to component consumption,
    said component feed apparatus further comprising a control part which always positions said component transfer unit at a position where the component transfer unit can receive the components from the component feed cassette on said second feed table corresponding to the component feed cassette on said first table when the component feed cassette on the first feed table is located at the component feed point,
    wherein said control part is operable to control, in the case of a component shortage at the component feed cassette on said first feed table, the supply of a component from the corresponding feed cassette on said second feed table, and then the supply of the component to the working machine via said component transfer unit.

11. A component feed apparatus as claimed in claim 4, wherein the component feed cassette, having components of the same kind as those of the component feed cassette on said first feed table, is loaded on said second feed table in order to cope with a component shortage due to component consumption,
    said component feed apparatus further comprising a control part which controls the apparatus so that, in case of a component shortage at the component feed cassette on said first feed table, the component from the corresponding component feed cassette on said second feed table is delivered to said component transfer unit and kept at said component transfer unit, and then, a component of another component feed cassette of the component feed cassettes on said first feed table is fed to the working machine until the components of the component feed cassettes on said first feed table are completely supplied to the working machine, and thereafter, the component kept at said component transfer unit is supplied to the working machine.

12. A method for feeding components to the working machine with use of the component feed apparatus as claimed in claim 1, the method comprising:

loading the component feed cassette, having components of the same kind as those of the component feed cassette on said first feed table, on said second feed table in order to cope with a component shortage due to component consumption; and supplying, via said component transfer unit, the component from the corresponding component feed cassette on said second feed table to the working machine in the case of a component shortage at the component feed cassette on said first feed table.

13. A component feed method as claimed in claim 12, further comprising controlling said component transfer unit and said second feed table so as to move relative to each other when the component feed cassette on said first feed table is present at the component feed point, so that said component transfer unit is always at a position where said component transfer unit can receive a component from the component feed cassette on said second feed table storing components of the same kind as those of the component feed cassette on said first feed table.

14. A method for feeding components to the working machine with use of the component feed apparatus as claimed in claim 4 in which said first feed table and said component transfer unit are coupled together, the method comprising:

loading the component feed cassette on said second feed table symmetrically in the right-left direction with respect to the component feed cassette on said first feed table, storing components of the same kind as those of the component feed cassette on said second feed table, in order to cope with component shortage due to component consumption;

positioning said component transfer unit such that said component transfer unit is always at a position to receive the component from the component feed cassette on said second feed table corresponding to the component feed cassette on said first feed table when the component feed cassette on said first feed table is located at the component feed point; and supplying, via said component transfer unit, a component from the corresponding component feed cassette on said second feed table to the working machine in the case of component shortage at the component feed cassette on said first feed table.

15. A method for feeding components to the working machine with use of a component feed apparatus according to claim 7, the method comprising:

loading the component feed cassette, having components of the same kind as the components stored in the component feed cassette on said first feed table, on said second feed table in order to cope with component shortage due to component consumption;

delivering a component from the corresponding component feed cassette on said second feed table to said component transfer unit when a component shortage is detected at the component feed cassette on said first feed table;

keeping the delivered component at said component transfer unit;

feeding components from other component feed cassettes on said first feed table to the working machine until the components present in the component feed cassettes on said first feed table are completely supplied to the working machine; and supplying the component kept at the component transfer unit to the working machine.

* * * * *